United States Patent
Boyle et al.

(10) Patent No.: US 7,736,747 B2
(45) Date of Patent: Jun. 15, 2010

(54) SILICON PARTS JOINED BY A SILICON LAYER PREFERABLY PLASMA SPRAYED

(75) Inventors: James E. Boyle, Saratoga, CA (US); Laurence D. Delaney, Whitefish, MT (US)

(73) Assignee: Integrated Materials, Incorporated, Sunnyvale, CA (US)

( * ) Notice: Subject to any disclaimer, the term of this patent is extended or adjusted under 35 U.S.C. 154(b) by 389 days.

(21) Appl. No.: 11/445,119

(22) Filed: Jun. 1, 2006

(65) Prior Publication Data

US 2006/0216908 A1  Sep. 28, 2006

Related U.S. Application Data

(62) Division of application No. 10/602,299, filed on Jun. 24, 2003, now Pat. No. 7,074,693.

(51) Int. Cl.
*B32B 9/04* (2006.01)
(52) U.S. Cl. ............... 428/446; 428/149; 428/428; 428/448; 427/452
(58) Field of Classification Search ............... 156/329; 427/452; 428/428, 446, 149; 118/500, 728; 432/258; 211/41.18; 29/559, 462; 438/85, 438/97, 455
See application file for complete search history.

(56) References Cited

U.S. PATENT DOCUMENTS

| | | | |
|---|---|---|---|
| 4,003,770 A * | 1/1977 | Janowiecki et al. ........... 438/97 |
| 4,449,286 A | 5/1984 | Dahlberg | |
| 4,849,305 A | 7/1989 | Yanagisawa ............... 428/695 |
| 5,009,359 A | 4/1991 | Stover et al. ............... 228/175 |
| 5,070,228 A | 12/1991 | Siemers et al. .......... 219/121.46 |
| 5,211,761 A | 5/1993 | Noguchi et al. .............. 136/258 |
| 5,770,273 A | 6/1998 | Offer et al. ................... 427/455 |
| 5,825,565 A * | 10/1998 | Papenburg et al. ........... 359/883 |
| 6,056,123 A | 5/2000 | Niemirowski et al. ....... 206/711 |
| 6,091,046 A | 7/2000 | Gilman et al. .......... 219/121.46 |
| 6,284,997 B1 | 9/2001 | Zehavi et al. .......... 219/121.46 |
| 6,450,346 B1 | 9/2002 | Boyle et al. ............... 211/41.18 |
| 6,787,195 B2 | 9/2004 | Wang et al. ................. 427/452 |
| 2003/0003686 A1* | 1/2003 | Boyle et al. ................. 438/455 |
| 2004/0094548 A1 | 5/2004 | Leveault | |

FOREIGN PATENT DOCUMENTS

| DE | 19747383 A1 | 10/1997 |
|---|---|---|
| JP | 05-175319 | 7/1993 |

* cited by examiner

*Primary Examiner*—Dung A Le
(74) *Attorney, Agent, or Firm*—Charles S. Guenzer

(57) ABSTRACT

A method of joining two silicon members and the bonded assembly in which the members are assembled to place them into alignment across a seam. Silicon derived from silicon powder is plasma sprayed across the seam and forms a silicon coating that bonds to the silicon members on each side of the seam to thereby bond together the members. The plasma sprayed silicon may seal an underlying bond of spin-on glass or may act as the primary bond, in which case through mortise holes are preferred so that two layers of silicon are plasma sprayed on opposing ends of the mortise holes. A silicon wafer tower or boat may be the final product. The method may be used to form a ring or a tube from segments or staves arranged in a circle. Plasma spraying silicon may repair a crack or chip formed in a silicon member.

19 Claims, 8 Drawing Sheets

SILICON PARTS JOINED BY A SILICON LAYER PREFERABLY PLASMA SPRAYED

RELATED APPLICATION

This application is a division of Ser. No. 10/602,299, filed Jun. 24, 2003 and now issued as U.S. Pat. No. 7,074,693.

BACKGROUND OF THE INVENTION

1. Field of the Invention

The invention relates generally to plasma spraying. In particular, the invention relates to joining silicon parts used in semiconductor fabrication equipment.

2. Background Art

Batch substrate processing continues to be used in fabricating semiconductor integrated circuits and similar micro structural arrays. In batch processing, many silicon wafers or other types of substrates are placed together on a wafer support fixture in a processing chamber and simultaneously processed. Currently most batch processing includes extended exposure to high temperature, for example, in depositing planar layers of oxide or nitride or annealing previously deposited layers or dopants implanted into existing layers. Although horizontally arranged wafer boats were originally used, vertically arranged wafer towers are now mostly used as the support fixture to support many wafers one above the other.

In the past, the towers and boats have been most often made of quartz or sometimes of silicon carbide for high-temperature applications. However, quartz and silicon carbide have proven unsatisfactory for many advanced processes. An acceptable yield of advanced integrated circuits depends upon a very low level of particles and metallic contaminants in the processing environment. Often the quartz towers develop excessive particles after a few cycles and must be reconditioned or discarded. Furthermore, many processes require high-temperature processing at above 1000° C. or even above 1250° C. Quartz sags at these high temperatures although silicon carbide maintains its strength to a much higher temperature. However, for both materials the high temperature activates the diffusion of impurities from the quartz or silicon carbide into the semiconductor silicon. Some of the problems with silicon carbide have been solved by coating the sintered SiC with a thin SiC surface coating deposited by chemical vapor deposition (CVD), which seals the contaminants in the underlying sintered silicon carbide. This approach, despite its expense, has its own problems. Integrated circuits having features sizes of 0.13 μm and below often fail because slip defects develop in the silicon wafer. It is believed that slip develops during initial thermal processing when the silicon wafers are supported on towers of a material having a different thermal expansion than silicon.

Many of these problems have been solved by the use of silicon towers, particularly those made of virgin polysilicon, as described by Boyle et al. in U.S. Pat. No. 6,450,346, incorporated herein by reference in its entirety. A silicon tower 10, illustrated orthographically in FIG. 1, includes three or more silicon legs 12 joined at their ends to two silicon bases 14. Each leg 12 is cut with slots to form inwardly projecting teeth 16 which slope upwards by a few degrees and have horizontal support surfaces 18 formed near their inner tips 20. A plurality of wafers 22, only one of which is illustrated, are supported on the support surfaces 18 in parallel horizontal orientation along the axis of the tower 10. For very high-temperature processing, it is preferred that there be four legs 12 and that the support surfaces 18 be arranged in a square pattern at 0.707 of the wafer radius from the center. A boat has much the same structure but with both bases configured on one side to support the horizontally arranged boat. The wafers are supported a few degrees from vertical both at the bottom of the slots and the tips of the teeth.

Many of these problems have been solved by the use of silicon towers, particularly those made of virgin polysilicon, as described by Boyle et al. in U.S. Pat. No. 6,450,346, incorporated herein by reference in its entirety. A silicon tower 10, illustrated orthographically in FIG. 1, includes three or more silicon legs 12 joined at their ends to two silicon bases 14. Each leg 12 is cut with slots to form inwardly projecting teeth 16 which slope upwards by a few degrees and have horizontal support surfaces 18 formed near their inner tips 20. A plurality of wafers 22, only one of which is illustrated, are supported on the support surfaces 18 in parallel horizontal orientation along the axis of the tower 10. For very high-temperature processing, it is preferred that there be four legs 12 and that the support surfaces 18 be arranged in a square pattern at 0.707 of the wafer radius from the center. A boat has much the same structure but with both bases configured on one side to support the horizontal arranged boat. The wafers are supported a few degrees from vertical both at the bottom of the slots and the tips of the teeth.

Superior results are obtained if the legs 12 are machined from virgin polysilicon (virgin poly), which is bulk silicon formed by chemical vapor deposition with silane ($SiH_4$) or a chlorosilane ($SiClH_3$, $SiCl_2H_2$, $SiCl_3H$, or $SiCl_4$) as the precursor. Virgin poly is the precursor material formed in multi-centimeter ingots, which is used for the Czochralski growth of silicon ingots from which wafers are cut. It has an exceedingly low level of impurities. Although virgin poly would be the preferred material for the bases 14, it is not usually available in such large sizes. Czochralski silicon may be used for the bases 14. Its higher impurity level is of lesser importance since the bases 14 do not contact the wafers 22.

Fabricating a silicon tower or boat, particularly out of virgin poly, requires several separate steps, one of which is joining the machined legs 12 to the bases 14. As schematically illustrated in FIG. 2, blind mortise holes 24 are machined into each base 14 with non-circular shapes in correspondence with and only slightly larger than ends 26 of the legs 12. Boyle et al. favor the use of a spin-on glass (SOG) that has been thinned with an alcohol or the like. The SOG is applied to one or both of the members in the area to be joined. The members are assembled and then annealed at 600° C. or above to vitrify the SOG in the seam between the members.

SOG is widely used in the semiconductor industry for forming thin inter-layer dielectric layers so that it is relatively inexpensive and of fairly high purity. SOG is a generic term for chemicals widely used in semiconductor fabrication to form silicate glass layers on integrated circuits. Commercial suppliers include Allied Signal, Filmtronics of Butler, Pa., and Dow Corning. SOG precursors include one or more chemicals containing both silicon and oxygen as well as hydrogen and possibly other constituents. An example of such as precursor is tetraethylorthosilicate (TEOS) or its modifications or an organo-silane such as siloxane or silsesquioxane. In this use, it is preferred that the SOG not contain boron or phosphorous, as is sometimes done for integrated circuits. The silicon and oxygen containing chemical is dissolved in an evaporable carrier, such as an alcohol, methyl isobutyl ketone, or a volatile methyl siloxane blend. The SOG precursor acts as a silica bridging agent in that the precursor chemically reacts, particularly at elevated temperature, to form a silica network having the approximate composition of $SiO_2$.

Boyle has disclosed an improvement of the SOG joining method in U.S. provisional application Ser. No. 60/465,021, filed Apr. 23, 2003 and incorporated herein by reference in its entirety. In this method silicon powder is added to the liquid SOG precursor to form a slurry. Terpineol alcohol is added to slow the setting time. The powder preferably has a particle size of between 1 and 50 μm and is prepared from virgin polysilicon. The slurry adhesive is applied to the joint before assembly and is cured similarly to the pure SOG adhesive to form a silica/polysilicon matrix with the polysilicon fraction being typically 85% or greater. The improved SOG/polysilicon adhesive is believed to be stronger than the pure SOG adhesive and contains a significantly lower fraction of silica originating from the SOG, thereby reducing the contamination problem. Nonetheless, a certain amount of silica remains, thereby reducing but not eliminating contamination and the tendency of the joint to dissolve in HF.

Two silicon members to be joined are separated by a gap having a thickness of about 50 μm (2 mils). The thickness of the gap represents an average separation of the leg 12 and the base 14 as the end 26 of the leg 12 is at least slidably fit in the mortise hole 24. The gap thickness cannot easily be further reduced because of the machining required to form the complex shapes and because some looseness of assembled members is needed to allow precise alignment of the support surfaces and other parts. A coating of the liquid SOG precursor or the SOG/silicon-powder mixture is applied to at least one of the mating surfaces before the two members 12, 14 are assembled such that the SOG precursor with optional silicon powder fills the gap 34 of FIG. 3. Following curing and a vitrification anneal at a temperature typically above 600° C., the SOG precursor with optional silicon powder changes into a solid having the structure of a silicate glass in a three-dimensional network of silicon and oxygen atoms and their bonds and optionally forming a matrix for the larger fraction of the embedded silicon crystallites.

Silicon towers and boats produced by this method have provided superior performance in several applications. Nonetheless, it is possible that the bonded structure and in particular the bonding material may still be contaminated. The very high temperatures experienced in the use or cleaning of the silicon towers, sometimes above 1300° C., may worsen the contamination. One possible source of the contaminants is the relatively large amount of SOG used to fill the joint between the members to be joined. Siloxane SOG typically used in semiconductor fabrication is cured at around 400° C. and the resultant glass is not usually exposed to high-temperature chlorine. However, it is possible, though the effect has not been verified, that the very high temperature draws out the few but possibly still significant number of contaminants in the SOG. The SOG/silicon mixture reduces the amount of SOG but does not eliminate it.

Some integrated circuit fabrication facilities require periodic cleaning of towers in hydrofluoric acid (HF). Silica, however, tends to be etched by HF so that SOG-bonded towers may come apart after HF cleaning.

Silicon towers need to be assembled with alignment tolerances of typically of the order of 25 μm in order to support wafers without rocking. Large mechanical jigs are used to align the members of an assembled towers before the bonding between the members is completed. A SOG adhesive presents two fabricational difficulties in maintaining the alignment. Typically the spin-on partially hardens or cures at room temperature in less than an hour. The hardening time can be lengthened somewhat by diluting the commercially available SOG precursor with alcohol or the like. Nonetheless, only about an hour is available to apply the SOG to the joining members, to assemble the members, and to align the members in the jig. While such quick fabrication is possible, it leaves little room for error or unexpected delays and impacts work scheduling. Furthermore, the alignment should be maintained during the final curing of the spin-on glass at 600° C. and typically even higher at 1200° C. As a result, the alignment jig should support the tower in the annealing furnace. Therefore, either the alignment is performed in a cooled furnace, which is thereafter raised to the curing temperature, or the jig and its supported assembled tower is inserted into a furnace, which may be kept at a somewhat elevated temperature. Again, placing the jig with its supported tower into an annealing furnace is possible, but such a process is inconvenient and slows throughput.

In U.S. Pat. No. 6,284,997, Zehavi et al. have disclosed a method of welding together silicon members, thereby avoiding the use of SOG and or a SOG/silicon mixture and their potential drawbacks. However, Zehavi et al. teach that cracks can be avoiding in welding silicon only by pre-heating the silicon members to at least 600° C. before the welding step heats the localized area of the weld seam to above the melting point of silicon, 1416° C. The welding method has proven successful at producing crack-free welds essentially free of contamination. However, welding 600° C. members is a difficult and unpleasant process. Furthermore, the 600° C. pre-heating needs to be performed with the members held in the alignment jig. So again, silicon welding is possible but has its drawbacks.

Siemens et al. in U.S. Pat. No. 5,070,228 disclose the use of plasma spraying to join parts composed of a limited number of specified reactive metals. The method has limited applicability to complex structures and requires pre-heating the parts in a non-reactive environment using a complex apparatus.

SUMMARY OF THE INVENTION

Two silicon parts, particularly silicon structural members, may be joined by plasma spraying silicon or otherwise depositing drops of liquid silicon or silicon vapor to the seam between the assembled parts. The sprayed silicon coating bonds the two silicon members together.

Plasma spraying may include injecting silicon powder into a gaseous plasma and directing the gas flow to the seam.

The method may be applied to the fabrication of many types of silicon structures including rings and tubes. It is especially advantageous in fabricating a tower formed from silicon bases and silicon legs with teeth for supporting multiple wafers.

Bevels may be cut into one or both members adjacent the seam. The bevels may be in the form of conical chamfers.

Spin-on glass (SOG) or a mixture of SOG and silicon powder, after being annealed to form a silicate glass, may be used as the primary adhesive between the members, in which case the sprayed on silicon seals the underlying spin-on glass. Other primary adhesives may be substituted.

A first member may be placed into a mortise hole formed in the second member, thereby typically forming principle surfaces of the two members that are perpendicular at the seam. The mortise hole may be blind. More preferably, the mortise hole extends though the second member, and silicon layers are plasma sprayed at both ends of the mortise hole to bond the two members together at locations space apart along the axis of the first member.

Small silicon tacks may be plasma sprayed to temporarily bond the pieces together to allow the removal of the structure from an alignment jig prior to final plasma spraying of a complete bonding layer or for annealing of a spin-on glass adhesive.

Cracks in silicon can be repaired by plasma spraying silicon into the crack, preferably after the crack has been machined into a more regular shape.

DETAILED DESCRIPTION OF THE PREFERRED EMBODIMENTS

Plasma spraying silicon across the seam separating two juxtaposed silicon parts has been demonstrated to form a silicon layer strongly bonded to both parts even when the parts are held at a temperature significantly below the melting point of silicon during bonding. The sprayed silicon coating may be used to seal an underlying adhesive, for example, of spin-on glass (SOG) or SOG/silicon mixture, or the sprayed silicon coating may be used as the primary bond between the parts. Alternatively, a silicon layer sprayed onto a smaller area of the joint may be used as a tack similar to a tack or spot weld to temporarily hold the two parts together.

Figure 3:
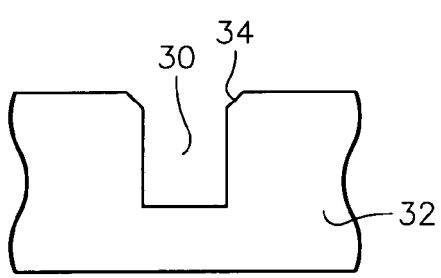
FIG. 3 is a cross-sectional view of chamfered blind mortise hole in a silicon base.

Although the invention may be applied to other silicon parts and structures, the following discussion will use the example of silicon wafer towers. The process for joining the parts of a silicon boat is very similar. Such structures are formed from silicon structural members composed in large part of silicon, which provides the principal mechanical support for the structure. Prior to assembly and joining the silicon members are free standing. As shown in the cross-sectional view of FIG. 3, a blind mortise hole 30, typically of non-circular shape, is machined part way into a silicon base 32. However, a chamfer 34 is machined into the base 32 at the top of the hole 30. The chamfer 34 preferably has an angle with respect to the top surface of the base 32 of between 20° and 60°, and 45° is a satisfactory compromise. Although other shapes of bevels may be used instead of the conical bevel of a chamfer to relieve the two members adjacent the seam, a straight chamfer is usually satisfactory. The same structure is formed for all mortise holes in both bases of the tower.

Figure 4:
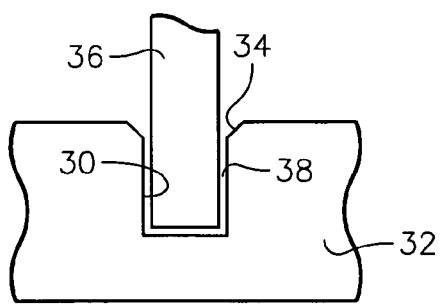
FIG. 4 is a cross-sectional view showing a silicon leg inserted into the mortise hole of FIG. 3.

The tower is then assembled with each end of a leg 36 fitted into the respective mortise hole 30, as illustrated in the cross-sectional view of FIG. 4. The end of the leg 36 is slightly smaller than the mortise hole 30 to form a gap 38 that allows easy insertion and limited flexibility for alignment. The gap 38, which is typically about 50 to 100 µm, is illustrated out of scale with the leg 36. After the leg 36 and base 32 have been aligned, its shape is less regular to accommodate the alignment. The illustration shows the leg 36 nearly filling the bottom of the mortise hole 30, but a larger space may be left there if desired.

Figure 5:
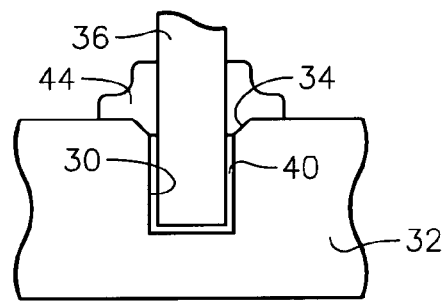
FIG. 5 is a cross-sectional view showing plasma sprayed silicon layer to bond the leg to the base.

In one embodiment, the liquid SOG precursor or the slurry of SOG and silicon powder is applied prior to assembly to one or both of the parts to be joined to form, as illustrated in the cross-sectional view of FIG. 5, an adhesive region 40 between the assembled parts. After assembly, an alignment jig aligns the tower to the tolerances of about 25 to 50 µm required for wafer support towers. After the tower has been aligned, the tower and jig are moved to an annealing furnace to cure the SOG in the adhesive region 40 at temperatures of up to about 1300° C. Other adhesives and curing processes may be substituted if the adhesive is properly sealed by the plasma sprayed silicon. Alternatively, the tower is aligned to a jig inside the cooled furnace, and thereafter the furnace is raised to the required annealing temperature.

Figure 6:
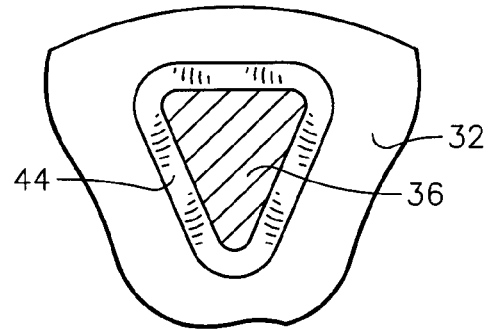
FIG. 6 is partially sectioned plan view corresponding to FIG. 5.
Figure 7:
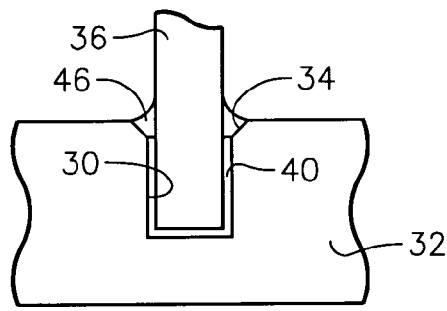
FIG. 7 is a cross-sectional view showing the silicon layer to be smoothed around the joint.

After adhesive curing, the bonded and rigid tower is removed from the furnace and the jig. The portions of the leg 36 and base 32 away from the joint are masked, for example, by molydenum foil. Low-temperature plasma spraying of silicon is then performed to deposit a relatively thick layer 44 of silicon, also illustrated in the plan view of FIG. 6, which fills the chamfer 34 and contacts both the planar principal surface of the base 32 and the cylindrical, usually non-circular, principal surface of the leg 36. These two principal surfaces are perpendicular to each other. The thickness of the silicon layer 44 is preferably at least 1/32" (0.8 mm) although thinner layers may be used in some situations. Optionally, as illustrated in the cross-sectional view of FIG. 7, the silicon layer 44 may be finish ground to form a smoothly shaped collar 46 which barely protrudes above the chamfer 34.

The silicon layer 44 or the reduced collar 46 serves two purposes. It provides additional mechanical strength to the joint and also seals the adhesive 40 below the silicon. Although it is not essential to the invention, the chamfer or bevel 34 is useful in increasing the mechanical strength and depressing the adhesive from the final surface.

Figure 8:
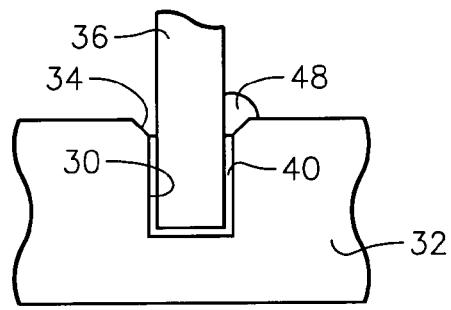
FIG. 8 is a cross-sectional view showing a silicon tack temporarily joining the silicon leg and base.

In a second embodiment of the invention, the adhesive is applied to the areas to be joined, and the tower is assembled and jigged. However, prior to the adhesive anneal with the tower still aligned in the jig, as illustrated in the cross-sectional view of FIG. 8, a small tack 48 of silicon is plasma sprayed into a small angular portion of the chamfer 34. The tack 48 operates similarly to a tack or spot weld in forming a small-area contact between the base 32 and leg 36 to temporarily bond the two together. A plasma-sprayed tack similarly joins each end of each leg 36 to its respective base 32. The tacks 48 provide sufficient mechanical strength to keep the tower in alignment after removal from the jig if care is taken to not shock the tower. The unjigged but joined tower is moved to the annealing furnace for the adhesive anneal. The tower is then removed from the furnace, its joints are masked, and the silicon layer 44, illustrated in the cross-sectional view of FIG. 8, is plasma sprayed to completely fill the chamfer 34. This embodiment eliminates the need to jig the tower inside the annealing furnace.

In a third embodiment, no adhesive is used, but the sprayed silicon layer provides the principal bond for the joint. If desired, the tack may be plasma sprayed with the structure in the alignment jig and the final plasma spraying is performed with the structure removed from the jig. With the blind mortise hole, the silicon layer 44 is sprayed on only a relatively narrow axial extent of the leg 36. As a result, the mechanical strength of the joint is reduced. This may be insufficient for wafer towers, but for other silicon structures subject to much less impact the limited bonding area may provide sufficient strength.

Figure 11:
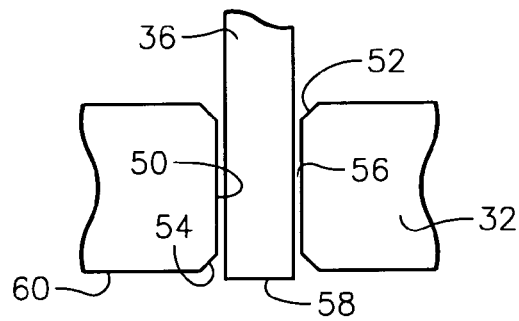
FIG. 11 is a cross-sectional view showing the silicon leg inserted through the mortise hole.
Figure 12:
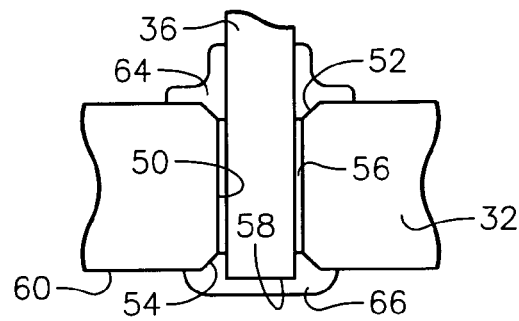
FIG. 12 is a cross-sectional view showing two plasma sprayed silicon layers bonding the leg to the based.
Figure 9:
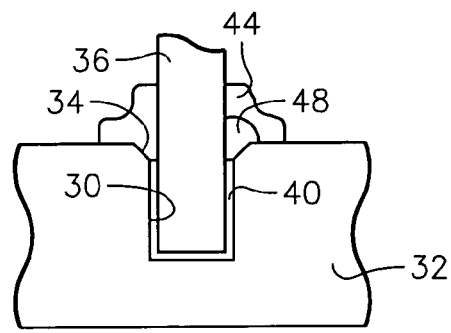
FIG. 9 is a cross-sectional view showing the tack covered with the plasma sprayed silicon layer.
Figure 10:
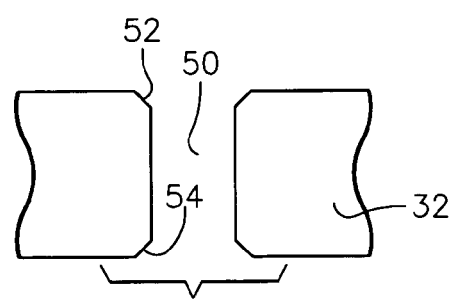
FIG. 10 is a cross-sectional view showing a chamfered through mortise hole in the silicon base.

Plasma spraying may be used with a through mortise hole to provide a strong joint without the need for an adhesive. As illustrated in the cross-section view of FIG. 10, a through mortise hole 50 is bored through the silicon base 32. Upper and lower chamfers 52, 54 are machined into the base at the opposed ends of the mortise hole 50. As illustrated in FIG. 11, the silicon leg 36 is inserted through the mortise hole 50 with a gap 56 being left between the leg 36 and the base 50. The axial position of an axial face 58 of the leg 36 should be near a planar bottom surface 60 of the base 50, but may be somewhat above or below it. The final position, whether above or below, may depend upon the final alignment. As illustrated in FIG. 12, a silicon collar 64 is plasma sprayed on one side of the base 32 to fill the upper chamfer 52 and to bond the base 32 to the sides of the leg 36. A silicon cap 66 is plasma sprayed on the other side of the base to cover the axial face 58 and side portions of the leg 36, to fill the lower chamfer 54, and planar portions of the bottom surface 60 of the base 32.

The two plasma sprayed layers 64, 66 bond portions of the leg 36 at opposite ends of the mortise hole 50, thereby providing a strong joint without the need for any adhesive. However, if desired, adhesive may be applied to the parts prior to assembly to fill the gap 56. The additional adhesive is particularly useful if the structure is to be used inside a vacuum chamber to prevent a virtual leak through the plasma sprayed silicon, which may be somewhat porous.

Figure 13:
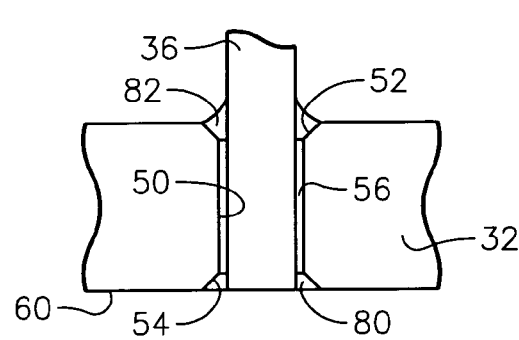
FIG. 13 is a cross-sectional view showing final grinding to smooth the silicon joint.

If desired, further machining smoothes the surfaces, as illustrated in FIG. 13. The collar 64 may be ground to form a shaped collar 82 barely protruding above the chamfer 52. The silicon cap 66 and possibly the end of the leg 36 may be ground smooth to form a bottom collar 80. If the bottom leg face 58 of FIG. 12 is recessed in back of the bottom base surface 60, then after grinding a portion of the silicon cap 66 extends across the center of the bottom collar 80. The smooth bottom surface is especially desirable on the lower base to provide a smooth support surface.

Temporary silicon tacks may be plasma sprayed on one end of the through mortise hole 50 to allow early removal of the tower from the alignment jig. Only one tack is required for each mortise hole 50.

Figure 14:
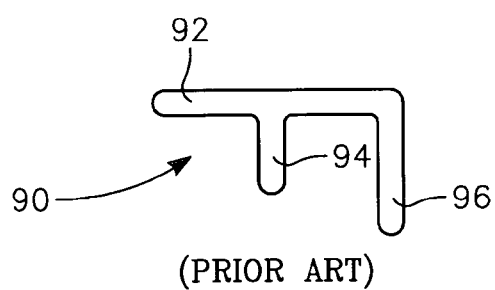
FIG. 14 is a cross-sectional view of a conventional shadow ring.

The invention, as previously mentioned, may be applied to silicon structures other than wafer support towers. It is particularly advantageous in forming large silicon rings. One such ring is a shadow ring 90, illustrated in cross section in FIG. 14. The shadow ring 90 is disposed around a silicon wafer to protect its edge from being sputter bonded to the pedestal supporting the wafer and also to protect the pedestal from being coated. It has a somewhat complex annular shape with a ledge portion 92 barely overhanging the periphery of the wafer. A first downward projection 94 supports the shadow ring 90 on the pedestal. A second downward projection 96 acts both as a baffle and to support the shadow ring 90 off the pedestal during wafer transfer. For sputtering onto 300 mm wafers, the shadow ring 90 may have a diameter of up to 450 mm. Silicon is a preferred material for the shadow ring 90 because of its low contamination and its identical coefficient of thermal expansion with the silicon wafer, which it may contact. Large blanks of silicon are available to form an integral shadow ring, but they are very expensive, and a large amount of the silicon is wasted when the central aperture is machined from a unitary blank.

Figure 15:
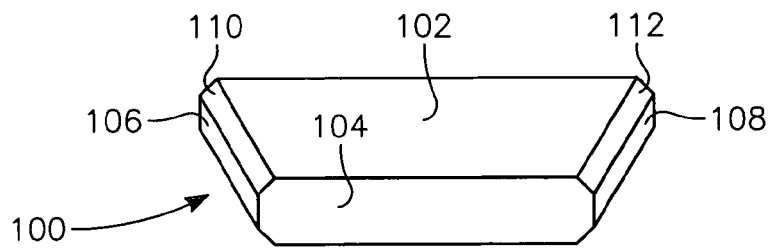
FIG. 15 is a cross-sectional view of a singly chamfered silicon segment used to form a ring.

The invention allows the easy fabrication of large silicon rings from a number of much smaller silicon segments bonded together in a circle. A singly chamfered segment 100 is illustrated orthographically in FIG. 15. It is a generally rectangular member having a top surface 102 and an unillustrated parallel bottom surface, an inner surface 104 and an unillustrated parallel bottom surface, and perpendicular thereto an inner surface 104 and an unillustrated back surface. However, the member has a first flat end surface 106 and a second flat end surface 108 which are offset from each other with respect to a ring radius and at least one of which is non-perpendicular to the front surface 104. The amount of angular offset depends upon the number N of such segments 100 used to form the ring. In general, the offset is 360°/N. Further, a first upper chamfer 110 is machined between the first end surface 106 and the top surface 102 and a yet unillustrated first bottom chamfer is machined between the first end surface 106 and the bottom surface. Similarly, a second upper chamfer 112 and as yet unillustrated second bottom chamfer are cut at the other axial end of the segment 100 adjacent the second end surface 108.

Figure 16:
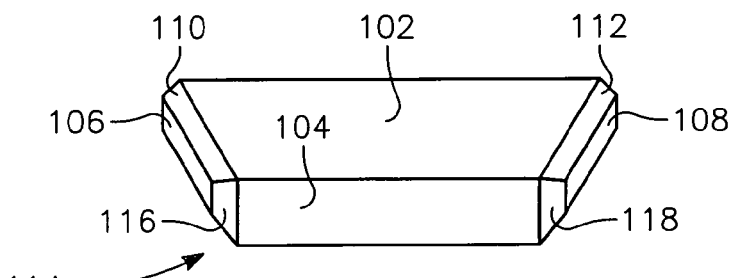
FIG. 16 is a cross-sectional view of a doubly chamfered silicon segment alternatively used to form the ring.

A doubly chamfered segment 114 illustrated in FIG. 16 additionally has a first inner chamfer 116 and a corresponding outer chamfer machined between the first end surface 106 and the inner surface 104 and the outer surface respectively. Similarly, a second inner chamfer 118 and a corresponding outer chamfer are machined between the second end surface 108 and the front surface 104 and the back surface respectively. The outer chamfers may be eliminated if the segment 114 is later circularized since they would be likely ground away during the circular machining.

Figure 17:
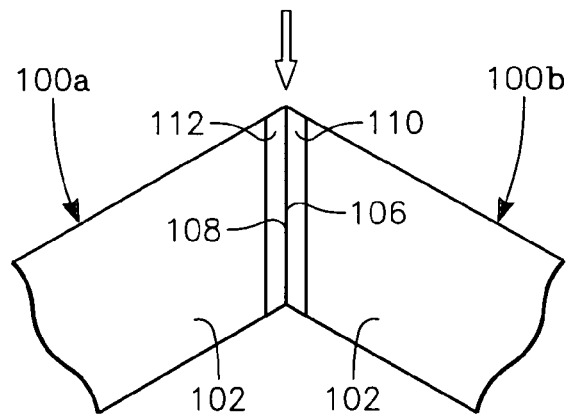
FIG. 17 is a plan view of two segments of FIG. 15 when abutted to form the ring.
Figure 18:
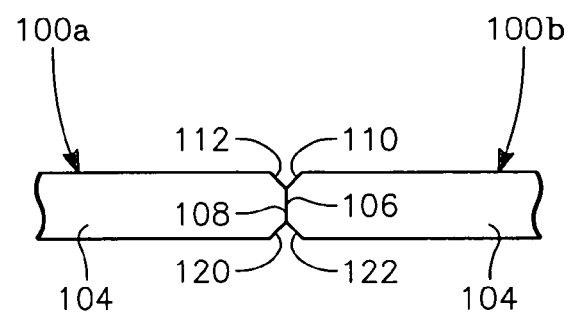
FIG. 18 is a outwardly radial elevation corresponding to FIG. 17.

The fabrication of the ring will be described with the use of the singly chamfered segment 100, but nearly the same process may be used with the doubly chamfered segment 102. As illustrated in plan view in FIG. 17 and in a radially outward elevation in FIG. 18, N segments 102, only two segments 100a, 100b being illustrated, are arranged and aligned in a jig to form a closed circle with the first end surface 106 of one segment 100b abutting the second end surface 108 of the adjacent segment 100a. Although the ring may be formed of any plural integral number of segments, at least four and more preferably at least six segments reduce the amount of wasted silicon. The upper chamfers 110, 112 form a V-shaped depression on one side of the ring, and the lower chamfers 120, 122 form another V-shaped depression on the other side of the ring.

Figure 19:
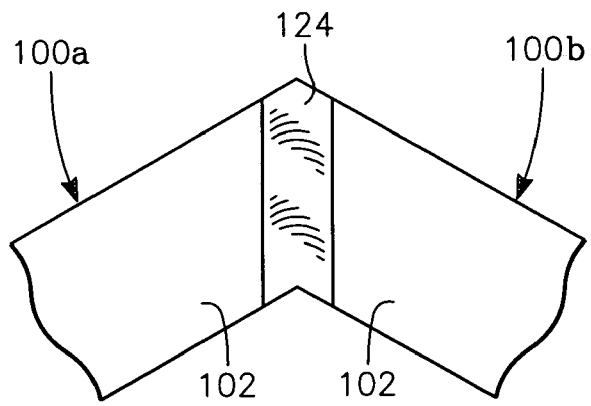
FIGS. 19 and 20 are a plan view and elevation respectively corresponding to FIGS. 17 and 18 after the joint has been bonded with two plasma sprayed silicon layers.
Figure 20:
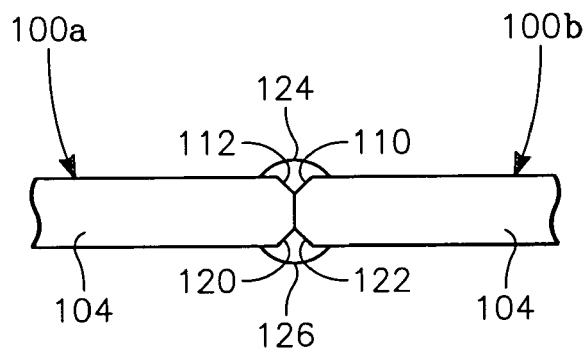
Figure 21:
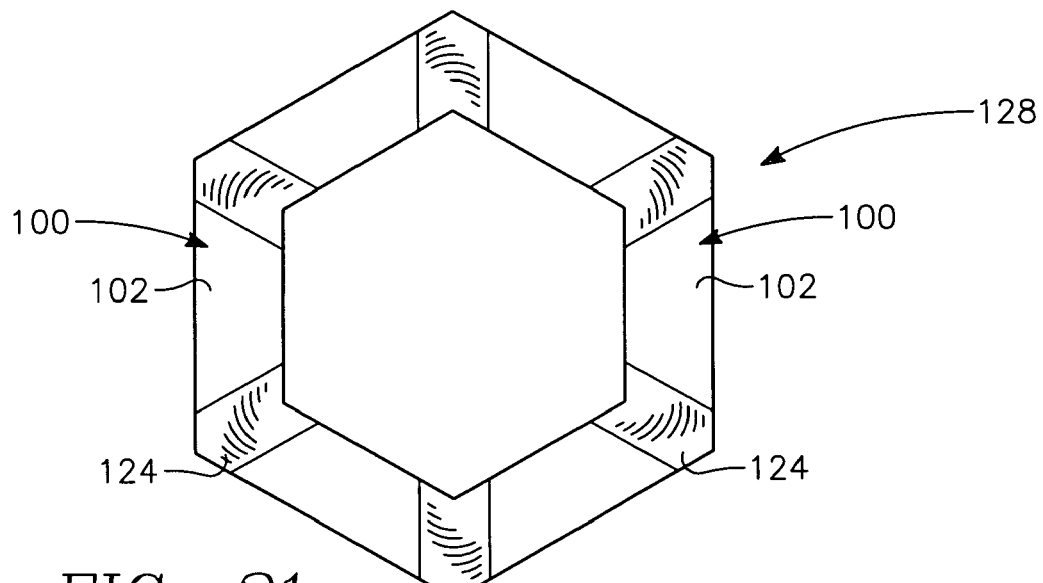
FIG. 21 is a plan view of the boned polygonal circle of the bonded segments of FIGS. 17 and 18.

As illustrated in plan view of FIG. 19 and in radially outward view in FIG. 20, a top silicon layer 124 is plasma sprayed on the top of the ring at the joint between the two segments 100a, 100b to fill the top chamfers 110, 112 and to contact planar portions of the top surface 102. Similarly, a bottom silicon layer 126 layer 126 is plasma sprayed on the bottom of the ring to fill the bottom chamfers 120, 122 and to contact planar portions of the bottom surface. Thereby, the two silicon layers 124, 126 bond to the two segments 100a, 100b and permanently fix them together. Similar, silicon layers are plasma sprayed at the other N-1 joints to form a polygonal ring 128 illustrated in plan view in FIG. 21 arranged around a central axis and having an aperture extending along that axis. The silicon layers 124, 126 can be ground to flatten the top and bottom surfaces of the ring. However, the smoothing can be combined with the machining required to circularize the ring and produce the desired cross section, such as the shadow ring 90 of FIG. 14. The circularization and wastage of silicon can be minimized if the segments 100 are cut from the silicon blanks as arcs having a curvature equal to that of the desired ring.

Optionally, adhesive may be applied between the end faces 108, 106 before assembly and cured prior to final silicon plasma spraying. If the ring 90 is to be used in a vacuum chamber, the adhesive reduces the virtual leakage from the small joint void between the silicon layers 124, 126A but exposed on the inner and outer sides.

Other types of silicon rings, such as clamp rings, plasma rings, slip rings for supporting wafer in rapid thermal processing (RTP), and pedestal rims can be formed in similar fashion.

Figure 22:
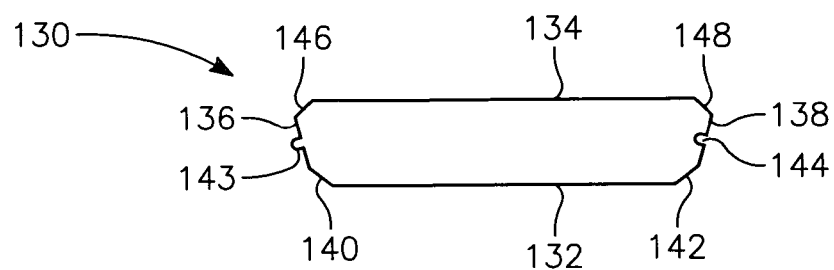
FIG. 22 is a plan view of an axial end of a silicon stave used to form a silicon tube.

Similar techniques can be used to form large tubular bodies, such as furnace and reactor liners and reactor vacuum chamber walls by the use of barrel staves. Boyle et al. describe the stave technique in the aforementioned patent, but using SOG adhesive as the primary bonding agent. A stave 130 illustrated in axial cross-section in FIG. 22 is machined to be shaped as a generally truncated wedge extending a substantial distance perpendicular to the plane of the illustration. The stave 130 has an inner face 132 and a parallel outer face 134. First and second side faces 136, 138 are offset from each other and at least one of them is not perpendicular to the inner and outer faces 132, 134. Inner chamfers 140, 142 are machined between the inner face 132 and the respective side face 136, 138. Similarly outer chamfers 144, 146 are machined between the outer face 134 and the respective side face 136, 138. Optionally to facilitate alignment, a tongue 143 is machined in the first side face 136 and a corresponding groove 144 is machined in the second side face 138. All these features preferably extend axially along the substantial axial length of the stave 130, which corresponds to the length of the final tube. The chamfers 140, 142 of the stave 130 corresponds to the chamfers 116, 118 of the doubly chamfered segment 114 of FIG. 16, and the stave 130 has much less need for the segment's chamfers 110, 112.

Figure 23:
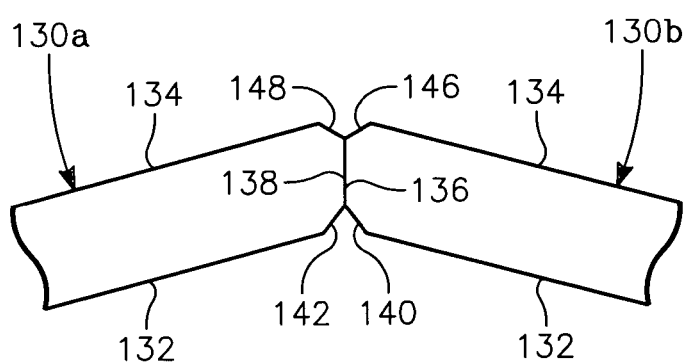
FIG. 23 is a plan view showing two silicon staves of FIG. 22 abutted to form a ring.
Figure 24:
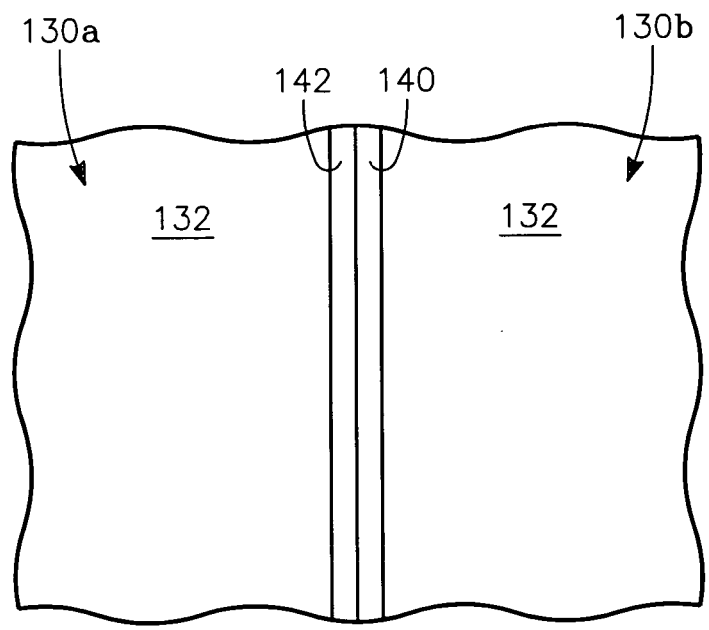
FIG. 24 is a outwardly radial elevation corresponding to FIG. 23.
Figure 25:
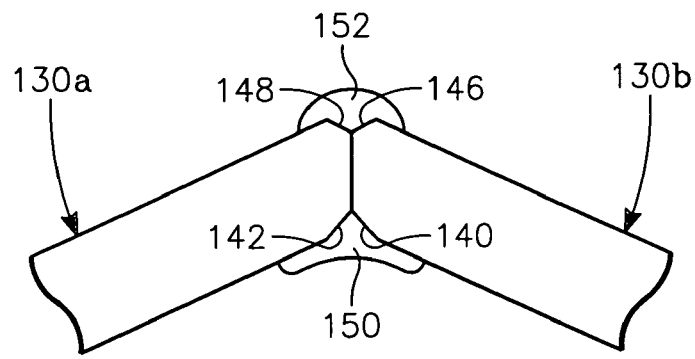
FIGS. 25 and 26 are a plan view and an elevation corresponding to FIGS. 23 and 24 showing two plasma sprayed silicon layers joining the two adjacent staves.
Figure 26:
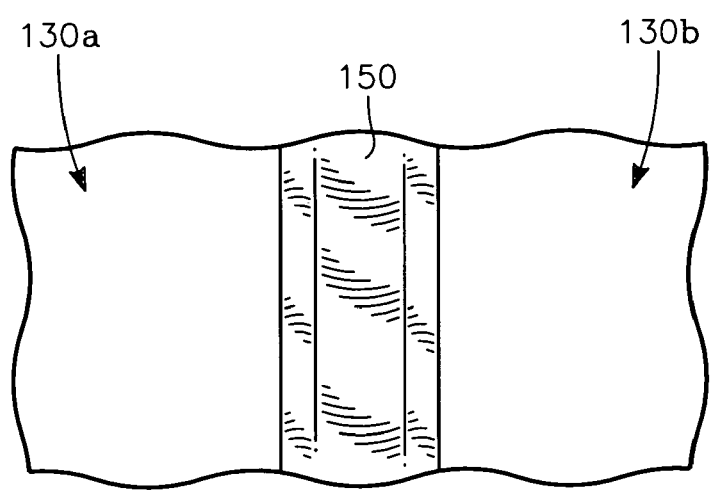
Figure 27:
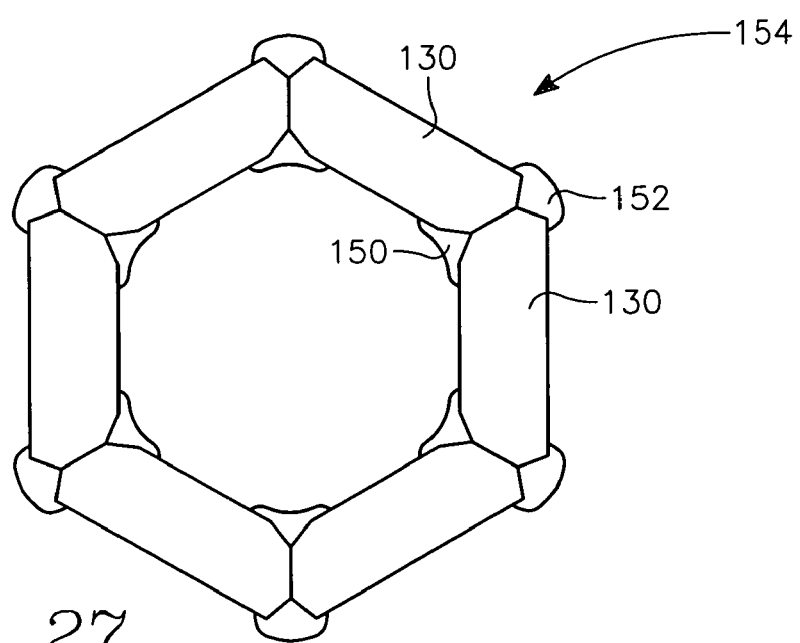
FIG. 27 is a plan view of an axial end of polygonal ring of bonded silicon staves.

The angular offset between the two side faces 136, 138 depends on the number N of staves 130 used to form a closed ring. A jig aligns the N staves 130 side by side in a circle. Two such staves 130a, 130b, though lacking the tongue and groove, are illustrated in the axial cross-sectional view of FIG. 23 and the outwardly radial elevation of FIG. 24 with the first side face 136 of one stave 130b abutting the second side face 138 of the other stave 130a. As shown in the axial cross-sectional view of FIG. 25 and outwardly radial elevation of FIG. 26, plasma spraying is used to deposit an axially extending inner silicon layer 150 filling the inner chamfers 140, 142 and a corresponding axially extending outer silicon layer 152 filling the outer chamfers 146, 148. If tacks are used, two tacks should be deposited on opposed axial ends of each joint. A resultant polygonal tube 154 is illustrated in axial cross section in FIG. 27 arranged around a central axis with an aperture including that axis. The inner and outer surfaces may be circularized or otherwise smoothed depending upon the need. If the tube 154 is to be used as a vacuum wall, adhesive should be applied between the staves 130 and cured prior to the final plasma spraying. If desired, a substantial thickness of silicon can be plasma sprayed on either the inner surface or the outer surface or both to form continuous layers of plasma sprayed silicon, which may thereafter be circularized.

Figure 28:
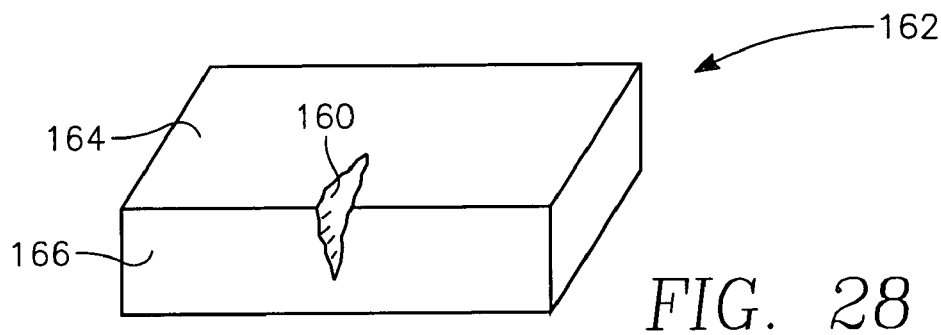
FIG. 28 is an orthographic view of a crack in a silicon member.

The invention can be used not only to fabricate silicon structures but also to repair a silicon member, even if already assembled into a complex structure. The tower 10 illustrated in FIG. 1 requires considerable expense in its fabrication. Particularly the leg 12 are expensive to machine because silicon is a brittle refractory material rather than a ductile metal and its machining is better characterized as grinding in which numerous small cuts are required to form each of the slots. On occasion, when the tower or boat is used for processing wafers, after repetitive temperature cycling in an annealing, a crack 160, illustrated in the orthographic view of FIG. 28, develops in a silicon member 162 forming part of the tower. Such cracks seem to arise most often in the bases. Usually, they appear to originate from a corner between two faces 164, 166 of the member 162. They appear to propagate a short distance along those two faces 164, 166 and then stop growing. Their cause is not clear, and towers have been successfully used even after a few such cracks 160 have developed. Nonetheless, cracks present a source of contamination. Further, there is a fear that on continued use, the cracks will expand or join to such an extent that the tower will shatter in the middle of a processing run, inevitably destroying valuable wafers. Similar surface defects are small shallow chips that are formed either at the corners on in planar surfaces.

Figure 29:
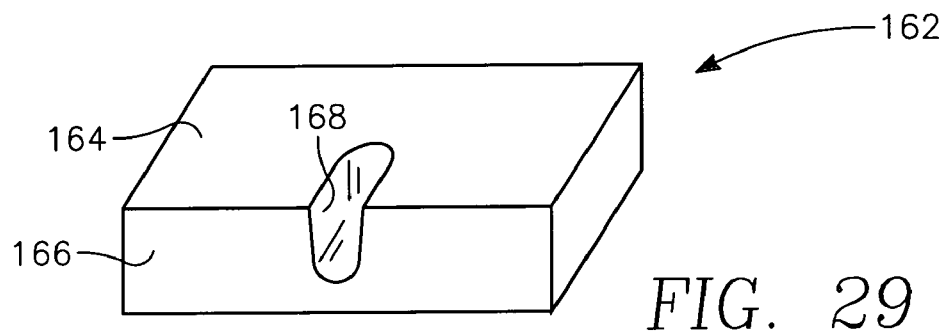
FIG. 29 is an orthographic view of a the crack of FIG. 28 after being machined to a larger more regular shape.
Figure 30:
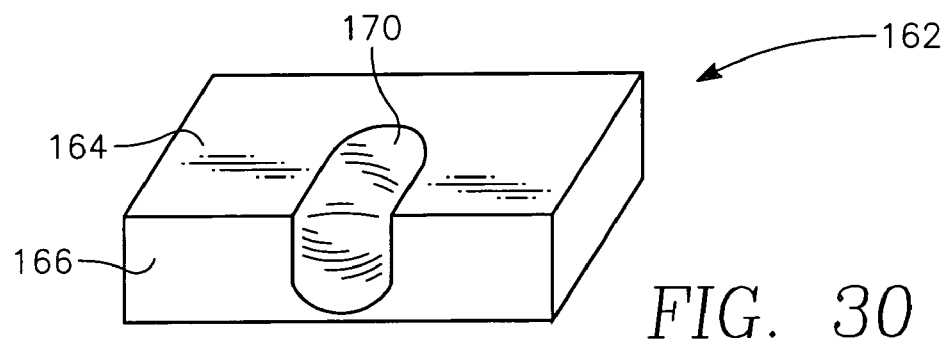
FIG. 30 is an orthographic view of a plasma sprayed silicon layer filling the crack.
Figure 31:
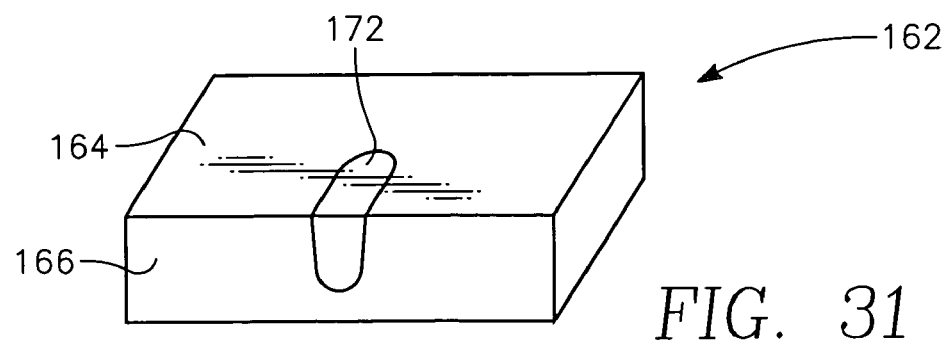
FIG. 31 is an orthographic view of the silicon layer of FIG. 30 after being ground smooth.

By use of plasma spraying, the crack 160 can be repaired, and the tower or other structure can be returned to service. The same technique may be used to repair chips. As illustrated in FIG. 29, the member 162 is machined in the area of the crack 160 to form a more regular hole 168 with a more open aspect ratio, preferably with sloping sides. A milling machine or a drill can be used for the machining. Alternatively, a Dremel tool can be manually operated to perform the limited amount of machining required. As illustrated in the orthographic view of FIG. 30, silicon is plasma sprayed on both of the faces 164, 166 to form a continuous silicon layer 170 that fills the machined hole 168 and extends above the original surfaces surrounding the hole 168. If desired, as illustrated in FIG. 31, both faces 164, 166 may be ground smooth to restrict the silicon layer 170 to the volume of machined hole 168 to form a planarized silicon layer 172 with perpendicular faces flush with the two member faces 164, 166. The same general procedure is followed if the crack 160 appears in only one face of the silicon members with the processing limited to that face. If the crack 160 is not too close to other members of the assembled structure, the repair can be performed without disassembling the structure. Further, there may be situations when an unassembled silicon member requires crack repair.

Figure 1:
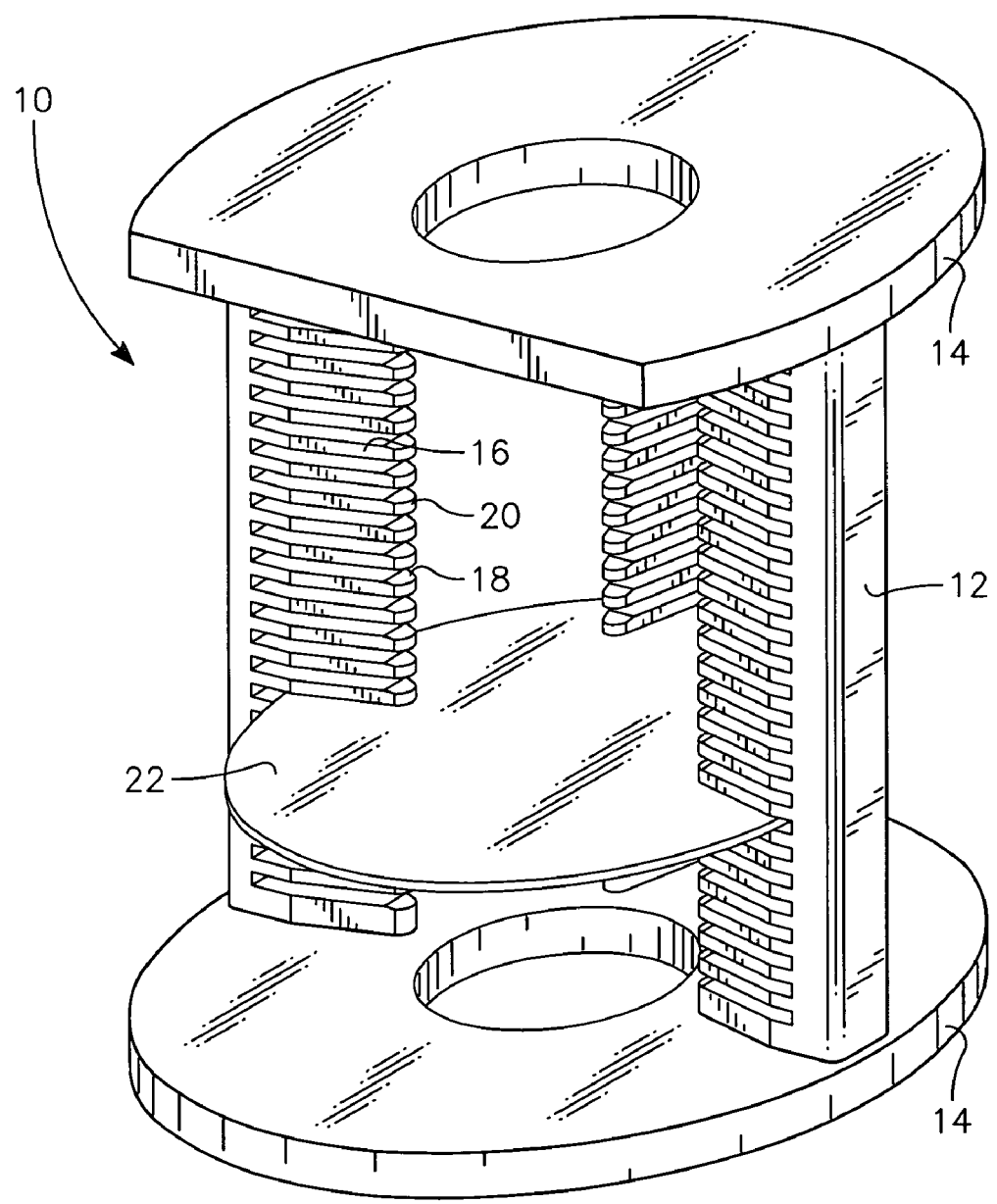
FIG. 1 is an orthographic view of a silicon wafer tower.
Figure 2:
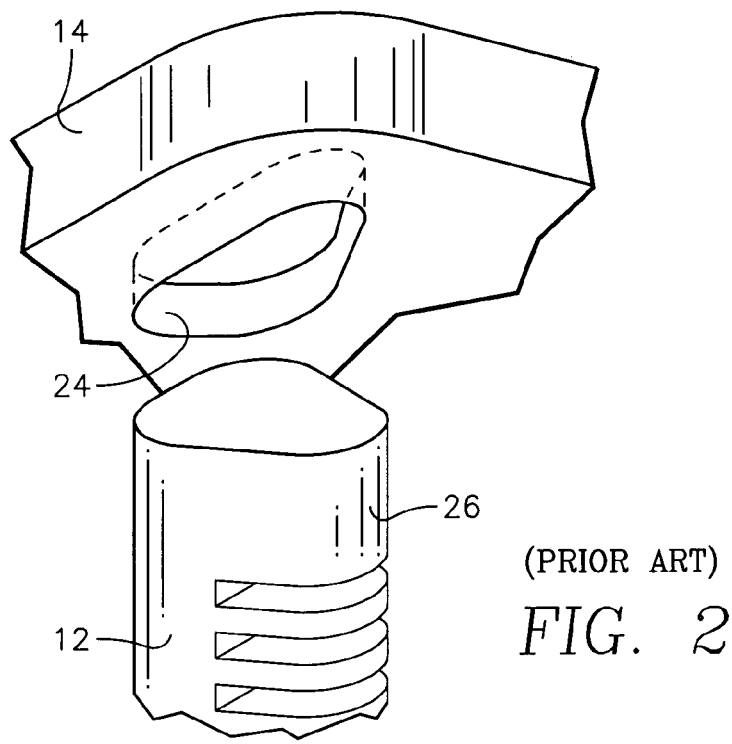
FIG. 2 is an orthographic view of two members of the tower and how they are joined.

The silicon tower 10 of FIG. 1 currently includes members composed of two types of silicon. The legs 12 are composed of virgin polysilicon, which exhibits an extraordinarily high pure level, thereby reducing contamination of the wafer 22 supported on the legs' teeth 16 during high temperature processing. Machining of virgin polysilicon may require the pre-annealing described by Boyle et al. in the aforesaid patent. The bases 14, on the other hand, are presently composed of Czochralski or cast polysilicon since the required large silicon blanks are not presently available in virgin polysilicon. Czochralski silicon is commercially available in ingots of diameters of up to 300 mm and for specialty use sometimes larger. Alternatively, plasma spraying of the invention may be used to bond together several relatively narrow rectangular plates of virgin polysilicon, which are thereafter machined into the desired shape for a base.

The plasma spraying of the invention can used to join any combination of types of silicon. Other types of silicon are available, for example, monocrystalline Czochralski silicon or cast or extruded silicon, the latter being particularly available in thin flat sheets. The most prevalent type of plasma spraying of silicon uses a silicon powder, for example having diameters in the range of 15 to 45 μm, which is entrained in the plasma and there liquified. Silicon powder is commercially available from Cerac having at least six 9s purity. Virgin polysilicon powder of significantly higher purity is obtainable from MEMC, but such purity may not be needed for parts away from wafer support areas in high-temperature processing. Even though the invention is particularly useful for joining silicon structures with a silicon bond, all of very high purity, the invention is not so limited and may be applied to silicon of lesser purity. For purposes of the invention, silicon unless specified otherwise is understood to include no more than 1 wt % of intentional or unintentional dopants or other contaminants and impurities.

Plasma spraying as that term is used in this invention uses a plasma or other high-temperature arc to cause a material typically in powder form injected into the plasma to at least be liquified and possibly vaporized. Resultant liquid drops or confined material vapor are directed toward the workpiece to be plasma sprayed. The material fluid, whether liquid drops or vapor, strikes the workpiece and immediately cools and turns to solid form on the substrate surface, thereby coating the workpiece. Typically the powder is entrained in an argon flow that is excited into a plasma adjacent the spray nozzle. Plasma spraying differs from arc welding or cutting in which the very high-temperature plasma arc extends to the workpiece and causes the workpiece material to melt. Typically, the workpiece is grounded to form one of the electrodes for the welding arc. In contrast, plasma spraying may be performed as a low-temperature operation in which the bulk of the workpiece is maintained at a temperature of no more than 200° C. although there may be situations where the workpiece is held at a temperature up to 500° C. It is possible to use a solid wire inserted into the plasma or arc as the material source. However, this still differs from arc welding with a filler in that the rod and workpiece do not form a common melt. Typically, to prevent the material fluid and condensed vapor from being oxidized, the main spray jet is enclosed in a coaxial shroud of inactive gas.

Although the low workpiece temperature afforded by plasma spraying is one of its advantages, the welding work of Zehavi et al. in the above cited patents showed that cracks were avoided during welding by maintaining the silicon workpieces at a temperature of at least 600° and even 800° C. There may be some situations where plasma spraying of silicon would benefit from workpiece temperatures above 600° C.

Other deposition methods may be used to deposit the silicon layer bonding the two members. However, plasma spraying is a flexible, easily used process that can be performed in the environment of a machine shop.

Plasma spraying to join silicon parts in the configuration of a tower has been demonstrated by A & A Company of South Plainfield, N.J. at the direction of the inventors. Ionic Fusion Corporation of Longmont, Colo. also performs low-temperature plasma spraying. Plasma spray torches are commercially available from Northwest Mettech of British Columbia. Their nozzles contain both the anode and cathode for the plasma.

The surface of the silicon workpieces to be plasma sprayed should be relatively free of oxide or other contaminants but the native oxide on silicon is too thin to cause problems. Preferably, the workpieces are cleaned beforehand. Adhesion of the sprayed silicon to the silicon workpieces can be improved by bead blasting the workpieces beforehand with, for example, high purity quartz, to produce work damage in the silicon in the form of pits and cracks. This form of microscopic roughening increases the adhesion of the deposited silicon layer.

Low-temperature plasma sprayed silicon can be visually identified. First, if the sprayed silicon layer and the silicon substrate are sectioned, a distinct seam separates the two silicon portions. Under a high-power optical microscope, the plasma sprayed silicon appears to have a speckled surface resembling the skin of an orange peel. Such structure is emphasized by treating the surface with Sirtl, a mix of hydrofluoric, nitric, and acetic acids with the possible addition of copper. In contrast, Czochralski polysilicon shows a structure of nominally aligned microcrystallites, cast polysilicon shows a more ragged structure of randomly oriented crystallites having a size of about 3 to 6 mm, virgin polysilicon shows a dendritic polycrystalline structure propagating from the growth seed, and Czochralski monocrystalline silicon appears like a mirror.

The invention thus allows silicon parts, particularly those of very high purity, to be joined to form a structure having high strength but exhibiting very low impurity levels. The method uses commonly available materials and is easily and economically practiced.

The invention claimed is:

1. A silicon structure, comprising:
   a first silicon part having a bulk portion consisting essentially of silicon;
   a second silicon part having a bulk portion consisting essentially of silicon and disposed adjacent to the first silicon part along a seam; and
   a layer of silicon bonded to both of the first and second silicon parts at portions thereof away from the seam and bridging over an external edge of the seam, wherein the first and second silicon parts are both capable of being free-standing if not bonded together by the layer of silicon.

2. The silicon structure of claim 1, wherein the layer of silicon is localized on the first and second silicon parts to areas thereof adjacent the seam.

3. The silicon structure of claim 1, wherein the layer of silicon comprises a layer of plasma sprayed silicon.

4. The silicon structure of claim 1, wherein each of the first and second parts comprises silicon selected from the group consisting of virgin polysilicon, Czochralski monocrystalline silicon, Czochralski polysilicon, and cast polysilicon.

5. The silicon structure of claim 1, wherein principal surfaces of the first and second silicon pails extend perpendicularly to each other at the seam.

6. A silicon substrate support fixture, comprising:
- first and second silicon bases each having mortise holes formed therein;
- a plurality of legs comprising virgin polysilicon, having teeth cut therein for supporting a plurality of substrates in parallel relationship, and inserted into the mortise holes to form respective seams between respective pairs of the bases and the legs; and
- layers of silicon bonded to portions of the bases and legs away from respective ones of the seams and bridging over external edges of respective ones of the seams to join the legs to the bases, wherein the layers of silicon are bonded to only localized areas of the bases and legs adjacent the seams.

7. The fixture of claim 6, wherein the bases and legs are not otherwise bonded to each other.

8. The fixture of claim 6, wherein the base and legs are also bonded to each other by an adhesive.

9. The fixture of claim 6, wherein the layers of silicon comprise layers of plasma sprayed silicon.

10. The fixture of claim 6, wherein each of the bases comprises silicon selected from the group consisting of virgin polysilicon, Czochralski monocrystalline silicon, Czochralski polysilicon, and cast polysilicon.

11. The fixture of claim 6, wherein the mortise holes pass through the bases and the layers of silicon are disposed on both sides of the bases for each of the mortise holes.

12. A silicon structure, comprising:
- a first silicon part;
- a second silicon part disposed adjacent to the first silicon part along a seam; and
- a layer of silicon bonded to both of the first and second silicon parts in portions thereof away from the seam and bridging over an external edge of the seam;
- wherein the structure is formed by the method of juxtaposing the two silicon parts to form the seam therebetween and plasma spraying silicon onto the silicon parts and across the seam to form the layer of silicon and to thereby join the two silicon parts.

13. The silicon structure of claim 12, wherein the two silicon parts are not joined together prior to the plasma spraying.

14. The silicon structure of claim 12, wherein the two silicon parts are also joined together by an adhesive.

15. The silicon structure of claim 12 comprising two silicon bases including a first one of the silicon parts and at least three silicon legs including a second one of the silicon parts and having teeth formed therein to support a plurality of substrates in parallel relationship.

16. The silicon structure of claim 12, comprising a plurality of silicon staves including the silicon parts and arranged in a closed pattern to form a tubular member.

17. The silicon structure of claim 16, wherein seams between the silicon staves are covered with plasma sprayed silicon.

18. The silicon structure of claim 16, wherein an adhesive disposed in the seams join the silicon staves together.

19. The structure of claim 12, wherein the layers of silicon are formed by plasma spraying including entraining silicon powder in a plasma of the plasma spraying.

* * * * *